US005739625A

United States Patent [19]

Falcus

[11] Patent Number: 5,739,625

[45] Date of Patent: Apr. 14, 1998

[54] SEGMENTED RING TRANSDUCERS

[75] Inventor: Steven John Falcus, Portland, United Kingdom

[73] Assignee: The Secretary of State for Defence in Her Britannic Majesty's Government of the United Kingdom of Great Britain and Northern Island, Hants, United Kingdom

[21] Appl. No.: 732,312

[22] PCT Filed: May 5, 1995

[86] PCT No.: PCT/GB95/01025

§ 371 Date: Oct. 28, 1996

§ 102(e) Date: Oct. 28, 1996

[87] PCT Pub. No.: WO95/30496

PCT Pub. Date: Nov. 16, 1995

[30] Foreign Application Priority Data

May 9, 1994 [GB] United Kingdom .................... 9409133

[51] Int. Cl.[6] ............................... H01L 41/08; B06B 1/06

[52] U.S. Cl. ............................................................. 310/328

[58] Field of Search ...................................... 310/328, 337

[56] References Cited

U.S. PATENT DOCUMENTS

| | | | |
|---|---|---|---|
| 3,043,967 | 7/1962 | Clearwaters | 310/328 |
| 3,177,382 | 4/1965 | Green | 310/328 |
| 3,230,505 | 1/1966 | Parker et al. | 310/328 |
| 4,814,660 | 3/1989 | Yamada et al. | 310/328 |
| 5,043,621 | 8/1991 | Culp | 310/328 |
| 5,103,130 | 4/1992 | Rolt et al. | 310/337 |
| 5,132,582 | 7/1992 | Hayashi et al. | 310/328 |
| 5,172,344 | 12/1992 | Ehrlich | 310/325 |

FOREIGN PATENT DOCUMENTS

| | | | |
|---|---|---|---|
| 61-27689 | 2/1986 | Japan | 310/337 |
| 2-248087 | 10/1990 | Japan | 310/330 |
| 2163925 | 3/1986 | United Kingdom | H04R 17/00 |

OTHER PUBLICATIONS

Soviet Physics Acoustics, vol. 37, No. 2, 1 Mar. 1991, pp. 142–144, XP 000234437, Glazanov V E et al "Input Impedance of a Radially Excited Incomplete Cylindrical Layer".

*Primary Examiner*—Thomas M. Dougherty
*Attorney, Agent, or Firm*—Nixon & Vanderhye P.C.

[57] ABSTRACT

A segmented ring transducer comprising a plurality of arcuate ring sections (21) coupled together, each section (21) comprising a plurality of rectangular piezoelectric ceramic blocks (22) arranged into a stack (27, 28) with one or more tapered wedges (23) spaced in the stack, the piezoelectric stack (27, 28) being assembled between opposed end couplings (24, 25), pre-stress bolts (26) connecting together the opposed end couplings (24, 25) in each ring section (21) to hold together each ring section assembly (21). The arcuate ring sections (21) can be identical. Adjacent ring sections (21) can be connected together by further bolts. Alternatively, the ring transducer can be formed as a split ring with an arcuate portion (20) of the ring missing, the arcuate portion being formed by omitting either one or more arcuate ring sections (21) or an arcuate portion (20) of the ring which is not equivalent to an integral number of arcuate ring sections (21). The segmented ring transducer can be constructed so that each arcuate portion (20) of the ring is identical and the wedges (23) are spaced in each arcuate ring section (21) such that in the assembled ring the ceramic blocks (22) form a regular polygon.

7 Claims, 1 Drawing Sheet

SEGMENTED RING TRANSDUCERS

The invention relates to transducers employing segmented rings of piezoelectric ceramic blocks as used for sound projectors in underwater applications and in particular to arrangements for applying a pre-stress to such piezoelectric blocks.

A transducer commonly used for low frequency, high output operation is the flextensional transducer as described in UK patents number 2211693 and 2209645. One disadvantage of these transducers is that depth compensation arrangements need to be provided for deep water operation otherwise there is a loss of linearity of performance. Free flooding ring transducers do not require depth compensation however.

Conventional ring transducers incorporate a number of linear stacks of rectangular shaped blocks of piezoelectric ceramic material separated by tapered wedges to form a ring arrangement. The segmented ring requires pre-stressing as an active transducer otherwise the mechanical couplings between the ceramic blocks and between the blocks and the wedges will fail when a certain level of ac voltage is applied to the piezoelectric elements. Thus the usable ac voltage will be relatively low and limit the acoustic output of the transducer. Known transducers use a compression band around the outer circumference of the segmented ring to keep the ceramic and the wedges under compression. The piezoelectric ceramic is poled and driven with an electrical ac voltage signal in its thickness mode which is perpendicular to the force applied by the pre-stress band.

The conventional pre-stress arrangement is non-ideal in that the ceramic is not pre-stressed in direction of its thickness mode. High power acoustic measurements on such known segmented rings have shown that these devices are susceptible to distortion. This is apparently brought about by mechanical joint failures due to lack of pre-stress exerted on the segmented ring by the pre-stress band. The conventional pre-stress band is formed around the segmented ring by means of a filament winding process. With these processes it is difficult to measure and control accurately the amount of pre-stress exerted on to the segmented ring. Furthermore, it is found that there is an uncertain reduction in the initial amount of pre-stress due to fibre relaxation.

U.S. Pat. No. 3,043,967 discloses a ring transducer comprising a number of arcuate ring sections, each section comprising a number of rectangular piezoelectric ceramic blocks with several tapered wedges spaced within the section. However, the piezoelectric ceramic blocks are pre-stressed using pre-stress bands and therefore suffers from the problems previously outlined.

The object of the invention is to provide a segmented ring transducer which overcomes the pre-stress difficulties of the known transducers.

The invention provides:

a segmented ring transducer comprising a plurality of arcuate ring sections coupled together, each arcuate ring section comprising a plurality of rectangular piezoelectric ceramic blocks arranged into a stack with one or more tapered wedges spaced in the stack characterised in that the piezoelectric stack being assembled between opposed end couplings, the opposed end couplings being connected together by pre-stress bolts in a ring section to hold together the ring section assembly.

Ideally, the arcuate ring sections in a ring transducer are identical. The adjacent arcuate ring sections can be connected together by further bolts.

The ring transducer may be formed into a complete ring or a split ring with an arcuate portion of the ring missing. The split ring may be formed by omitting one or more identical arcuate ring sections or by omitting an arcuate portion of the ring which is not equivalent to an integral number of arcuate ring sections.

Preferably, each arcuate portion of the ring or split ring is identical and the wedges are spaced in each arcuate section such that in the assembled ring the ceramic blocks form a regular polygon.

The invention will now be described by way of example only with reference to the accompanying Drawings of which:

Figure 1:
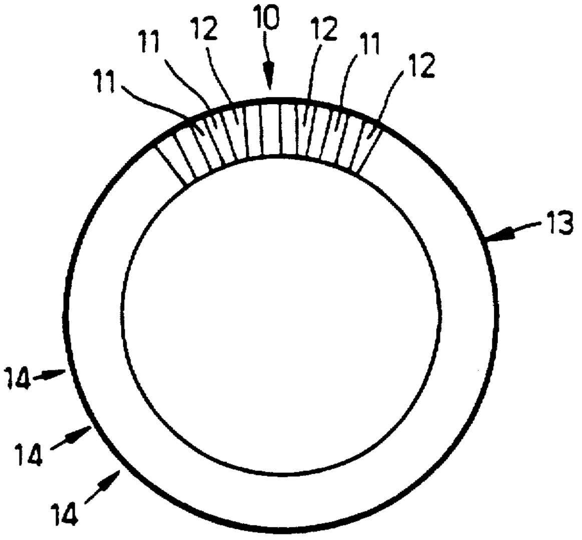
Fig.1. (PRIOR ART)
FIG. 1 illustrates a plan view of a conventional segmented ring transducer.

In a known segmented ring transducer 10 groups or stacks 11 of piezoelectric ceramic blocks 11 are separated by tapered wedges 12 to form a ring arrangement. A band 13 is filament wound around the ring of piezoelectric blocks 11 and wedges 12 to provide an inward radial pre-stress force as indicated by reference number 14. The piezoelectric ceramic material blocks are poled and driven in the thickness mode by an electrical ac voltage signal in well-known manner. The thickness mode movements of the piezoelectric ceramic blocks 11 are circumferential and thus perpendicular to the direction 14 of the stress applied by the pre-stress band 13.

The pre-stress band is formed by filament-winding a continuous resin-coating ceramic fibre around the ring of ceramic blocks 11 and wedges 12. Control of the tension during filament winding is difficult and it is difficult to measure accurately the amount of pre-stress exerted on the segmented ring. In addition, relaxation of the filament after winding leads to an unpredictable reduction in pre-stress. Such lack of manufacturing control of the pre-stress leads to ring transducers which are not optimised and not easily reproducible.

Figure 2:
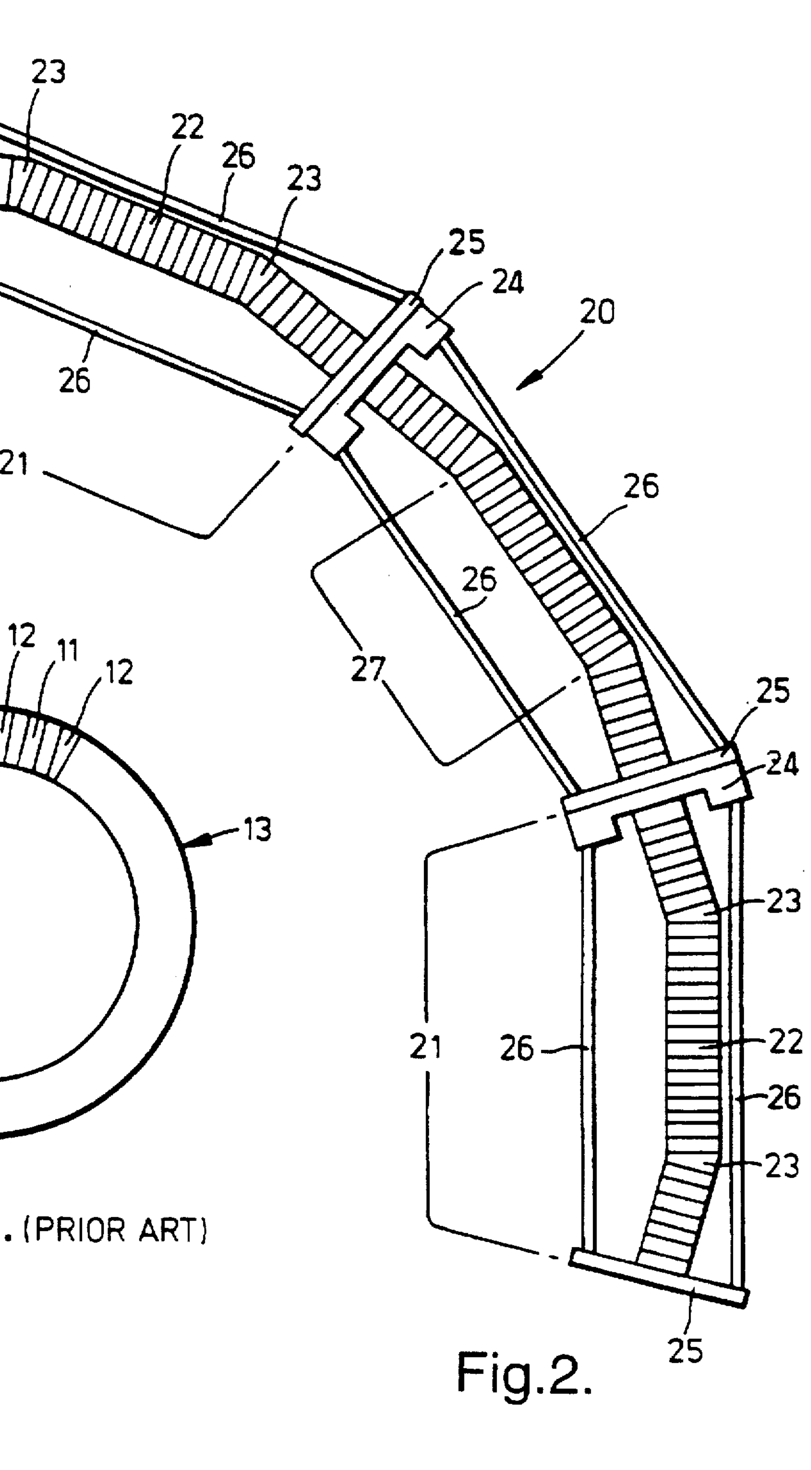
FIG. 2 shows a portion of a similar plan view of a transducer according to the invention.

FIG. 2 shows a portion 20 of a ring transducer according to the invention. Discrete identical arcuate ring sections 21 of piezoelectric ceramic blocks 22 and wedges 23 are separately pre-stressed by means of complementary couplings 24 and 25 with bolts 26 applying the pre-stress in each section. The couplings 24 and 25 of adjacent arcuate sections are then connected to form the ring transducer. As shown, each arcuate section 21 is formed of a central linear stack 27 separated from two half-length stacks 28 by the wedges 23. Other arrangements of linear stacks are possible but in all cases the pre-stress applied by means of the pre-stress bolts 26 is generally along the length of the stacks of piezoelectric blocks and thus in line with the thickness mode expansion and contraction of the ceramic material.

Tests on individual arcuate sections 21 have shown that it is possible to apply a controlled amount of force to keep the ceramic and wedges in compression. The amount of pre-stress applied should also allow the ceramic and wedges to be kept under compression at high drive or electrical signal levels and hence there will be no acoustic distortion.

In addition to the arrangement described above the separate arcuate sections 21 may be assembled into a split ring with an arcuate portion missing. The missing portion may be equivalent to one or more arcuate sections 21 or otherwise. Split rings formed of a single piece of piezoelectric ceramic material have been shown to have promising results and such split ring transducers can be easily simulated using arcuate sections according to the present invention. Such an arrangement would enable the split ring transducer to operate at greatly reduced frequencies than previously possible and thus in the frequency range of most interest for active underwater transmission.

The frequency range of operation is dependent on the physical size of the ring and by use of ring diameters in excess of im the transducer can operate at frequencies below 1 KHz. Transducers according to the invention should provide high source levels over a large bandwidth at low frequencies and, because the ring is free flooded, the transducer does not require depth compensation as required by flextensional transducers.

I claim:

1. A segmented ring transducer comprising a plurality of arcuate ring sections (21) coupled together, each section (21) comprising a plurality of rectangular piezoelectric ceramic blocks (22) arranged into a stack with one or more tapered wedges (23) spaced in the stack characterised in that the piezoelectric stack is assembled between opposed end couplings (24, 25), the opposed end couplings (24, 25) being connected together by pre-stress bolts (26) in a ring section to hold together the ring section assembly (21).

2. A segmented ring transducer as claimed in claim 1 wherein the arcuate ring sections (21) are identical.

3. A segmented ring transducer as claimed in claim 1 wherein adjacent ring sections are connected together by further bolts.

4. A segmented ring transducer as claimed in claim 1 wherein the ring transducer is formed as a split ring with an arcuate portion of the ring missing.

5. A segmented ring transducer as claimed in claim 4 wherein the split ring is formed by omitting one or more arcuate ring sections (21).

6. A segmented ring transducer as claimed in claim 5 wherein the split ring is formed by omitting an arcuate portion of the ring which is not equivalent to an integral number of arcuate ring sections.

7. A segmented ring transducer as claimed in claim 1 wherein each arcuate portion (21) of the ring is identical and the wedges (23) are spaced in each arcuate ring section such (21) that in the assembled ring the ceramic blocks (22) form a regular polygon.

* * * * *